US010425092B2

(12) United States Patent
Shu et al.

(10) Patent No.: US 10,425,092 B2
(45) Date of Patent: Sep. 24, 2019

(54) SUBSAMPLING PHASE FREQUENCY DETECTOR FOR A DIVIDER-LESS PHASE-LOCKED LOOP

(71) Applicant: Oracle International Corporation, Redwood Shores, CA (US)

(72) Inventors: Guanghua Shu, Belmont, CA (US); Frankie Y. Liu, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 260 days.

(21) Appl. No.: 15/647,716

(22) Filed: Jul. 12, 2017

(65) Prior Publication Data

US 2019/0020350 A1 Jan. 17, 2019

(51) Int. Cl.
*H03L 7/20* (2006.01)
*H03L 7/08* (2006.01)

(52) U.S. Cl.
CPC . *H03L 7/20* (2013.01); *H03L 7/08* (2013.01)

(58) Field of Classification Search
CPC ... H03L 7/08; H03L 7/20; H03L 7/085; H03L 7/089; H03L 7/0891; H03L 7/091; H03L 7/10
See application file for complete search history.

(56) References Cited

U.S. PATENT DOCUMENTS 5,365,202 A * 11/1994 Mori .................. H03L 7/087
331/12
5,521,948 A * 5/1996 Takeuchi .............. H03L 7/087
331/11

(Continued)

OTHER PUBLICATIONS

X.Gao, E. Klumperink and B. Nauta, "Sub-sampling PLL techniques," 2015 IEEE Custom Integrated Circuits Conference (CICC), San Jose, CA, 2015, pp. 1-8. (Year: 2015).*

*Primary Examiner* — Jaweed A Abbaszadeh
*Assistant Examiner* — Brian J Corcoran
(74) *Attorney, Agent, or Firm* — Park, Vaughan, Fleming & Dowler LLP (57) ABSTRACT

The disclosed embodiments relate to a system that controls a phase-locked loop (PLL), eliminating harmonic locking issues during subsampling operation and achieving better noise performance. During operation, the system performs a procedure to measure a first duty cycle that indicates a relationship between a reference signal, which has a frequency $F_{REF}$, and a voltage-controlled oscillator (VCO) output signal, which has a frequency $F_{VCO}$ and is generated by a VCO. The system also performs the procedure to measure a second duty cycle that indicates a relationship between a second reference signal (with a frequency of $c*F_{REF}$) and the VCO-output signal. Next, the system determines a frequency and phase relationship between the reference signal and the VCO-output signal based on the first and second duty cycles. Finally, the system uses the frequency and phase relationship to adjust the VCO so that the VCO-output signal, which is used as an output of the PLL, is frequency and phase aligned with the reference signal.

20 Claims, 9 Drawing Sheets

(56) References Cited

U.S. PATENT DOCUMENTS

| | | | |
|---|---|---|---|
| 7,209,533 B1* | 4/2007 | Nguyen | H03L 7/08 375/376 |
| 7,737,743 B1* | 6/2010 | Gao | H03L 7/087 327/156 |
| 8,373,481 B2* | 2/2013 | Gao | H03L 7/07 327/149 |
| 2006/0017471 A1* | 1/2006 | Nguyen | H03D 13/002 327/3 |
| 2007/0205836 A1* | 9/2007 | Xu | H03L 7/20 331/25 |
| 2009/0284286 A1* | 11/2009 | van den Berg | H03B 21/00 327/107 |

* cited by examiner

SUBSAMPLING PHASE FREQUENCY DETECTOR FOR A DIVIDER-LESS PHASE-LOCKED LOOP

BACKGROUND

Field

The disclosed embodiments generally relate to the design of a phase-locked loop (PLL). More specifically, the disclosed embodiments relate to the design of a divider-less PLL, which makes use of a subsampling phase and frequency detector (SSPFD) to generate a feedback signal without causing harmonic-locking issues, and improves overall noise performance of the PLL.

Related Art

Figure 1:
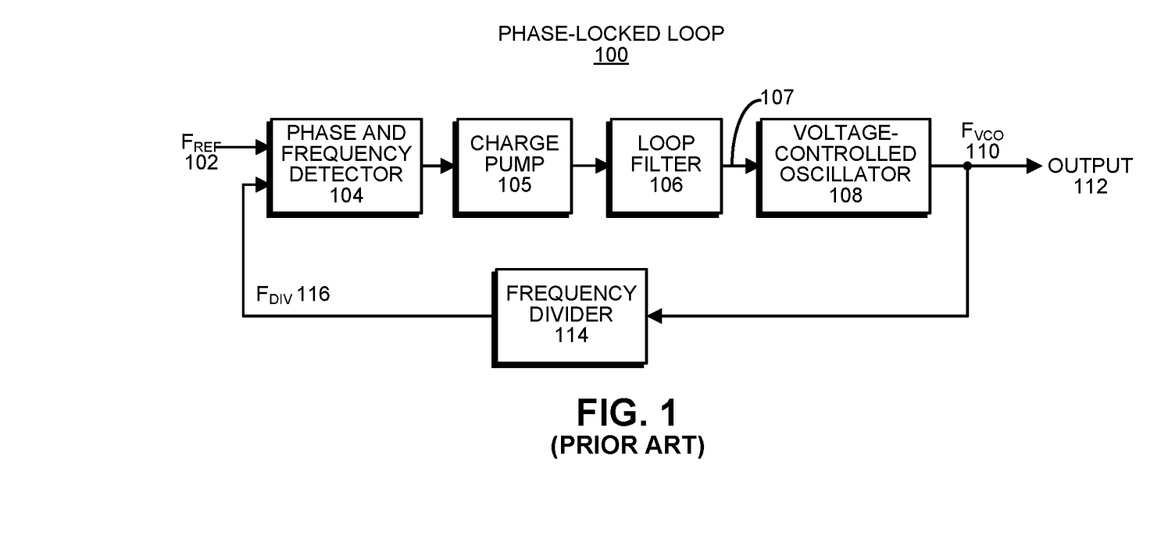
FIG. 1 illustrates an exemplary PLL.

Computer systems often make use of a number of PLLs to generate clock signals, which are used to synchronize circuits located on various semiconductor chips in the computer system. Each PLL is typically synchronized with a reference frequency signal $F_{REF}$, which is propagated throughout the computer system. For example, FIG. 1 illustrates an exemplary PLL 100 suitable for use in such a computer system. As illustrated in FIG. 1, PLL 100 includes a voltage-controlled oscillator (VCO) 108, which generates an output signal 112 having a frequency $F_{VCO}$ 110. Output signal 112 feeds in to a frequency divider 114 to produce an output 116, which has a divided frequency $F_{DIV}$, wherein $F_{DIV}=F_{VCO}/M$. The output of frequency divider 114 feeds back around in to a phase and frequency detector 104, which compares $F_{DIV}$ 116 against a reference frequency $F_{REF}$ 102. The resulting output of phase and frequency detector (PFD) 104, which indicates a frequency difference between $F_{REF}$ 102 and $F_{DIV}$ 116, feeds through a charge pump (CP) 105 and a loop filter (LPF) 106 to produce an error signal 107, which feeds in to a control input of VCO 108. This error signal causes VCO 108 to adjust $F_{VCO}$ 110 to be aligned with $F_{REF}$ 102, thereby "locking" the output 112 of the PLL 100 with reference frequency $F_{REF}$ 102.

Unfortunately, the presence of frequency divider 114 in PLL 100 creates a number of problems. First, the divide-by-M behavior of the feedback loop causes the noise contributions of PFD 104 and CP 105 to increase by approximately $20*\log(M)$ dB, which can limit the in-band noise performance of PLL 100. Divider 114 also creates noise, which is multiplied by $M^2$ when observed at PLL output 112. Finally, divider 114 consumes additional power and requires more area, especially if divider 114 provides a large division factor.

Hence, what is needed is a new design for a PLL, which does not suffer from the above-described problems of existing PLL designs that make use of divider circuits.

SUMMARY

The disclosed embodiments relate to the design of a system for controlling a phase-locked loop (PLL). During operation, the system performs a procedure to measure a first duty cycle that indicates a frequency relationship between a reference signal, which has a frequency $F_{REF}$, and a voltage-controlled oscillator (VCO) output signal, which has a frequency $F_{VCO}$ and is generated by a VCO in the PLL. While performing this procedure, the system uses a first edge of the reference signal, which is either a rising or falling edge, to clock the VCO-output signal into a first D-flip-flop (D-FF), and uses a second edge of the reference signal, which is opposite the first edge, to clock the output of the first D-FF into a second D-FF. Next, the system exclusive-ORs the output of the first D-FF with the output of the second D-FF to generate a PR signal, and then performs a duty-cycle measurement on the PR signal to measure the first duty cycle. The system also performs the procedure to measure a second duty cycle that indicates a relationship between the VCO-output signal and a second reference signal, which has a frequency of $c*F_{REF}$. Next, the system determines a frequency and phase relationship between the reference signal and the VCO-output signal based on the first and second duty cycles. Finally, the system uses the determined frequency and phase relationship to adjust the VCO so that the VCO-output signal, which is used as an output of the PLL, is frequency and phase aligned with the reference signal.

In some embodiments, the first and second duty cycles are measured concurrently using parallel circuits, which each include a first D-FF, a second D-FF and an exclusive-OR gate.

In some embodiments, the first and second duty cycles are measured sequentially using a single circuit, which includes the first D-FF, the second D-FF and an exclusive-OR gate.

In some embodiments, the coefficient c, which is derived from the reference frequency $F_{REF}$ to produce a derived reference frequency $c*F_{REF}$. This derived reference frequency is used while measuring the second duty cycle to prevent frequency aliasing problems caused by aligned harmonics between the first and second duty cycles.

In some embodiments, determining the frequency and phase relationship between $F_{REF}$ and $F_{VCO}$ based on the first and second duty cycles involves using a lookup table to look up the frequency and phase relationship based on the first and second duty cycles.

In some embodiments, performing the duty-cycle measurement on the PR signal involves using the PR signal to charge a capacitor when the PR signal is high and discharge the capacitor when the PR signal is low, and then measuring a voltage across the capacitor to determine the duty cycle.

In some embodiments, performing the duty-cycle measurement involves using a time-to-digital converter (TDC) to measure a delay to a specific signal transition within each cycle of the PR signal, wherein the delay is proportionate to the duty cycle.

In some embodiments, the PLL is an analog PLL, which includes an analog loop filter located between the subsampling phase frequency detector (SSPFD) and the VCO.

In some embodiments, the PLL is a digital PLL, which includes a digital loop filter located between the SSPFD and the VCO.

In some embodiments, after the PLL achieves frequency locking, the method further comprises deactivating and/or turning off components in an SSPFD, which includes the first and second D-FFs and the exclusive-OR gate.

BRIEF DESCRIPTION OF THE FIGURES

Table I presents duty cycle values for the frequency detector output PR for a sequence of integer values of $F_{VCO}/F_{REF}$ in accordance with the disclosed embodiments.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), flash drives and other portable drives, or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

In order to mitigate the above-described drawbacks of using a divider in a PLL, the "subsampling" concept has developed to eliminate divider noise. (See [Gao2009] X. Gao, E. A. M. Klumperink, M. Bohsali and B. Nauta, "A Low Noise Sub-Sampling PLL in Which Divider Noise is Eliminated and PD/CP Noise is Not Multiplied by N2," in *IEEE Journal of Solid-State Circuits*, vol. 44, no. 12, pp. 3253-3263, December 2009. Also, see [Mark2016] N. Markulic et al., "A self-calibrated 10 Mb/s phase modulator with −37.4 dB EVM based on a 10.1-to-12.4 GHz, −246.6 dB-FOM, fractional-N subsampling PLL," in *IEEE International Solid-State Circuits Conference (ISSCC)*, San Francisco, Calif., 2016, pp. 176-177.) However, the "harmonic-locking" problem is well known in such subsampling systems, and all previous subsampling PLLs do not provide a direct scheme to break the symmetry that causes the harmonic-locking behavior. (See [Gao2009] and [Mark2016].)

The disclosed embodiments provide a new design for a subsampling frequency and phase detector (SSPFD), which solves the harmonic-locking problem and can be used in both analog and digital PLLs. This new design provides a number of advantages. First, the new PLL design resolves the harmonic-locking problem during subsampling operations without the assistance of conventional divider-based locking-mitigation techniques. Second, the new design introduces a digital implementation for an SSPFD, which achieves better robustness over process-voltage-temperature (PVT) variations than existing analog subsampling phase detectors. Finally, the new design can be used with both analog and digital subsampling PLLs to resolve the above-described problems related to dividers in conventional PLLs.

Details

We now elaborate on the basic operating principal behind the proposed SSPFD, its application in subsampling PLLs, and some practical design considerations. We first describe the frequency-detection capabilities of the proposed SSPFD. As shown in the diagram that appears in FIG. 2A, the SSPFD includes two D-flip-flops (FF) 202-204 and an XOR gate 219.

Figure 2A:
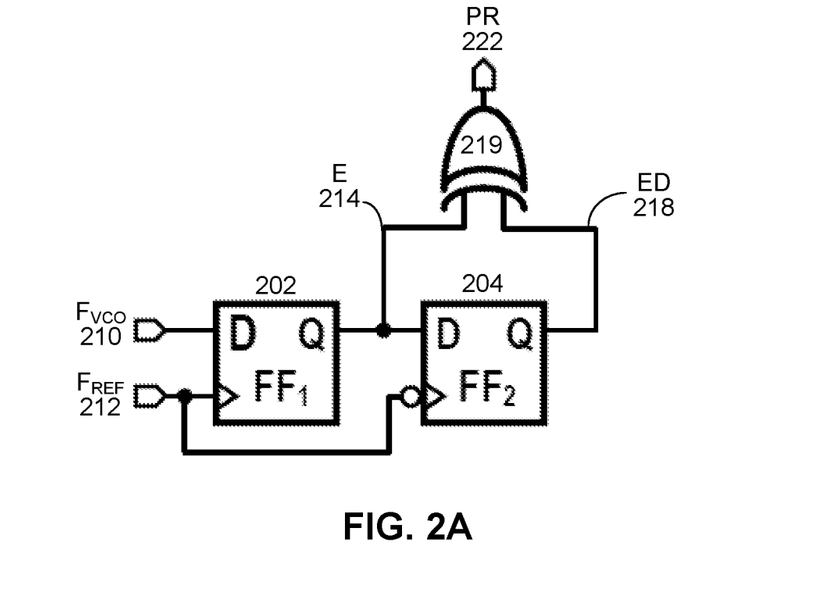
FIG. 2A illustrates a subsampling frequency detector in accordance with the disclosed embodiments.
Figure 2B:
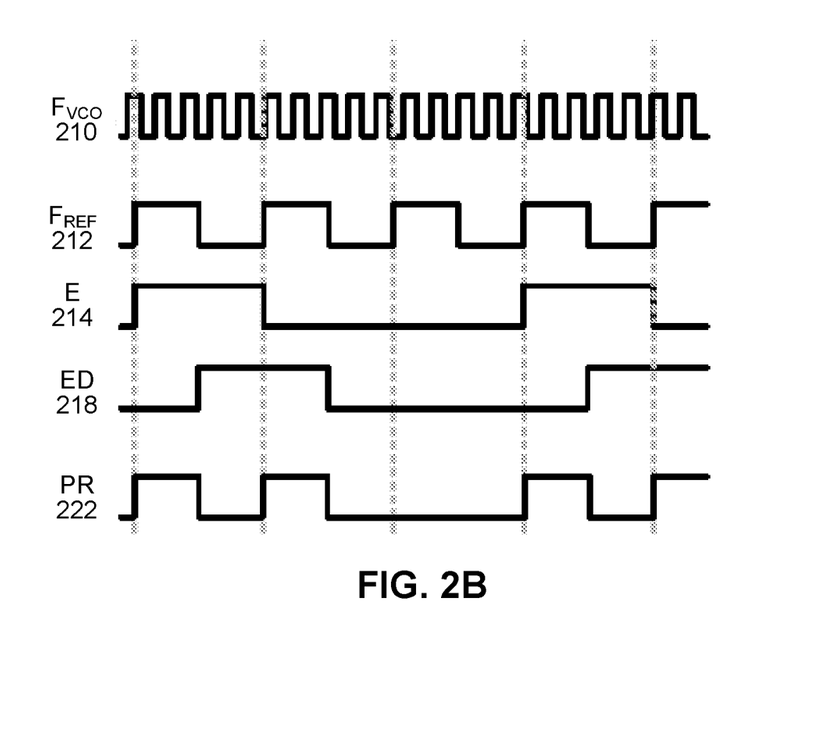
FIG. 2B illustrates a corresponding timing diagram for the subsampling frequency detector illustrated in FIG. 2A in accordance with the disclosed embodiments.

Moreover, the timing diagram presented in FIG. 2B depicts various signal levels during operation of the frequency detector. Note that $F_{VCO}$ 210 and $F_{REF}$ 212 represent the VCO-oscillator frequency and the crystal reference frequency for the PLL, respectively. Also note that $F_{VCO}$ is usually divided by a factor M (which represents the divisor in a conventional PLL) before it is fed back and compared against $F_{REF}$ 212. In subsampling PLLs, the divider is eliminated, and the $F_{VCO}$ 210 is directly compared with $F_{REF}$ 212 as is illustrated in FIG. 2A. The output of D-FF$_1$ 202, E 214, is then retimed by D-FF$_2$ 204, which clocks on the falling edge of $F_{REF}$ 212, to generate its delayed version, namely ED 218. XOR gate 219 receives E 214 and ED 218 as inputs and produces signal PR 222 as the frequency detector output. (Note that in the following discussion, we interchangeably refer to the two clock signals as $F_{REF}$ 212 and $F_{VCO}$ 210, and use the same labels to indicate their respective frequencies. However, it should be clear from the specific usage context whether we are referring to the signal or its frequency.) As shown in the timing diagram illustrated in FIG. 2B, $F_{REF}$ 212 samples $F_{VCO}$ 210 at every rising edge of $F_{REF}$ 212. The resulting sample is stored in E 214, and the previous sample is stored in ED 218. Whenever E 214 and ED 218 differ, PR 222 is asserted. By construction, PR 222 pulses are half a reference period wide. Intuitively, the frequency of such pulses in PR 222 provides an indication of the frequency relationship between $F_{VCO}$ 210 and $F_{REF}$ 212. For example, if $F_{VCO}=1*F_{REF}$, that is, they both are at the same frequency, E 214 and ED 218 are always at the same level and no pulse is generated on signal PR 222. In contrast, when $F_{VCO}=1.5*F_{REF}$, PR 222 pulses occur exactly half the time, which leads to a 50% average duty cycle for PR 222.

Figure 3:
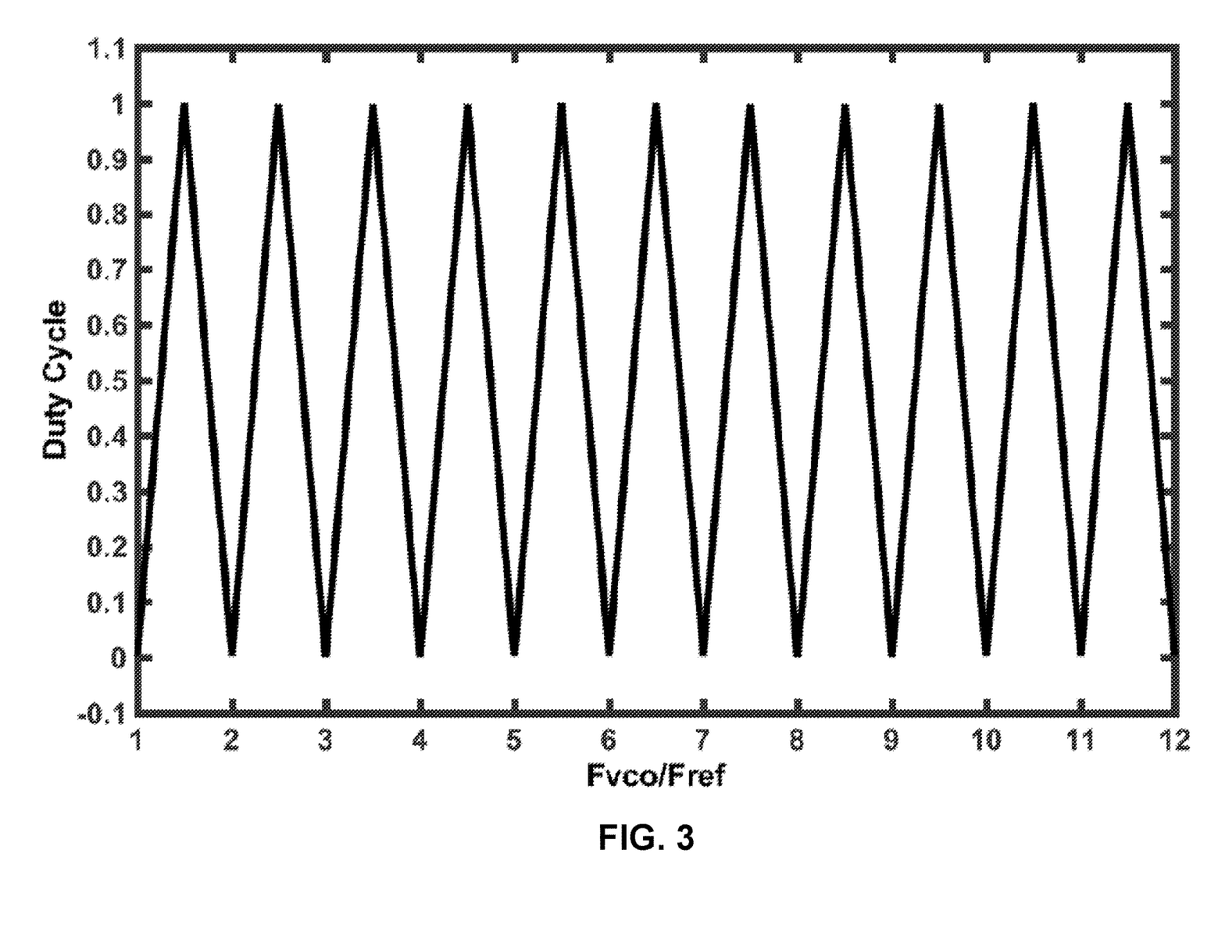
FIG. 3 illustrates an average duty cycle for the frequency detector output (PR) in accordance with the disclosed embodiments.
Figure 4:
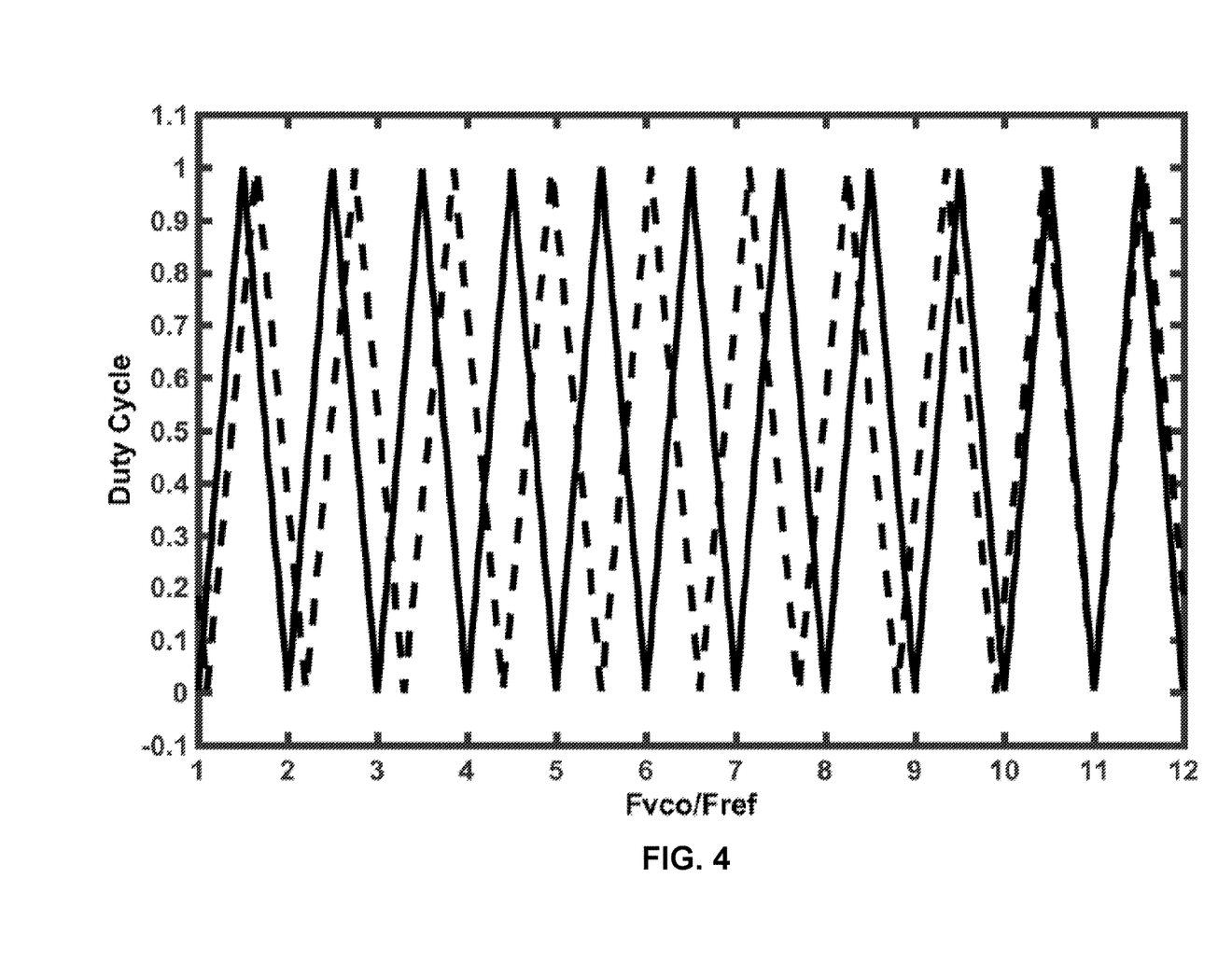
FIG. 4 illustrates the basic principle underlying the subsampling frequency detection process in accordance with the disclosed embodiments.

FIG. 3 presents a graph of exemplary simulation results, which illustrates the relationship between the duty cycle of PR 222 and the ratio of $F_{VCO}/F_{REF}$ (Note that 50% duty cycle is normalized to 1, and the same applies in FIG. 4). If we use the duty cycle information directly to achieve frequency locking, the harmonic-locking issue also exists for a proposed frequency detector because the duty cycle of PR 222 is zero whenever $F_{VCO}$ is an integer multiple of $F_{REF}$. Also note that within each harmonic interval, the frequency relationship can be uniquely defined by taking the duty cycle of PR and the slope of the change in duty cycle into consideration.

Therefore, a major challenge is to break the symmetry that causes harmonic locking, thereby achieving a wide frequency-locking range. This can be accomplished by introducing an imbalance in the harmonic periodicity in PR 222. For example, in FIG. 4 the solid line illustrates the duty-cycle curve that appears in FIG. 3, and the dashed line illustrates another duty cycle curve for the case where the reference frequency $F_{REF}$ is 1.1 times higher. As can be seen in FIG. 4, both curves have a periodic behavior, but with different periods. Two important observations should be noted: (i) the least common period for both conditions is 11 reference cycles, and (ii) at each harmonic point, the combined duty cycle information of the two curves is unique, as can be seen in the graph in FIG. 4. These two observations indicate that it is possible to eliminate harmonic locking during a subsampling operation by examining both of these duty cycles.

616, and then use frequency-detection logic to perform the frequency locking in accordance with Table I. Because the relationship is unique from harmonic 1 to harmonic 11 as shown in FIG. 4 and Table I, the proposed scheme can also be applied to fractional-N PLLs by using appropriate logic circuits following the ADC.

Figure 5:
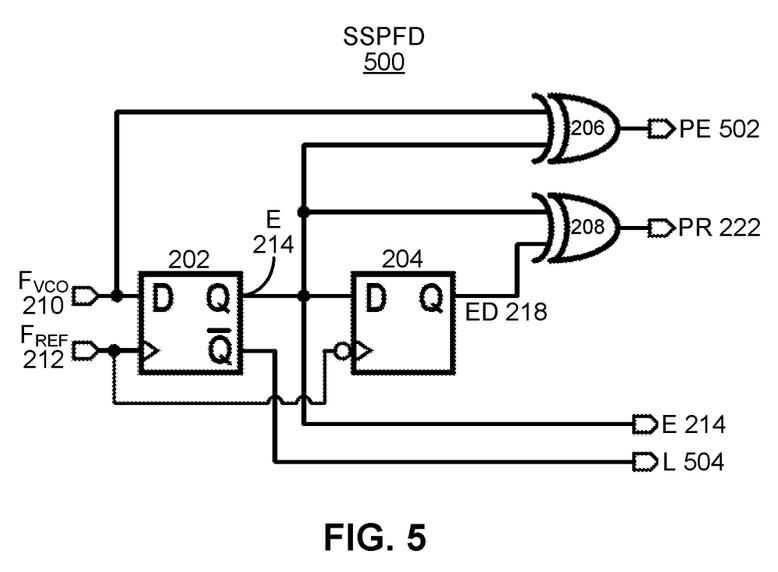
FIG. 5 illustrates a subsampling phase and frequency detector (SSPFD) implementation in accordance with the disclosed embodiments.

Furthermore, it is straightforward to extend the proposed frequency detector illustrated in FIG. 2A to produce the subsampling phase and frequency detector (SSPFD) 500, which is depicted in FIG. 5. This SSPFD 500 provides interfaces both for an analog PLL, including signals PR 222 and PE 502, and for a digital PLL, including signals PR 222, E 214 (early) and L 504 (late). Variations of SSPFD 500 in FIG. 5, namely $SSPFD_1$ 602 and $SSPFD_2$ 603, appear in the PLL embodiments illustrated in FIGS. 6A and 6B, respectively, along with an associated subsampling circuit 612.

Figure 6A:
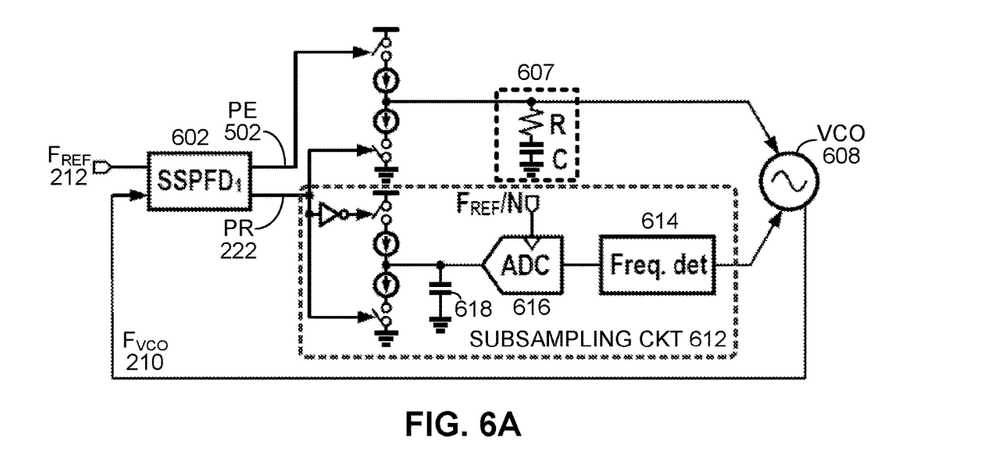
FIG. 6A illustrates an analog PLL which includes an SSPFD in accordance with the disclosed embodiments.

The embodiment illustrated in FIG. 6A is an analog PLL, which includes an analog loop filter 607 located between $SSPFD_1$ 602 and the VCO 608. In this embodiment, the duty-cycle measurement is performed by using PR signal 222 to charge a capacitor 618 when PR 222 signal is high and discharge capacitor 618 when PR signal 222 is low. The voltage across capacitor 618 is then measured using analog-to-digital converter 616, and this measurement passes through frequency detector 614, which determines a corresponding frequency, which is fed into an input of VCO 608.

Figure 6B:
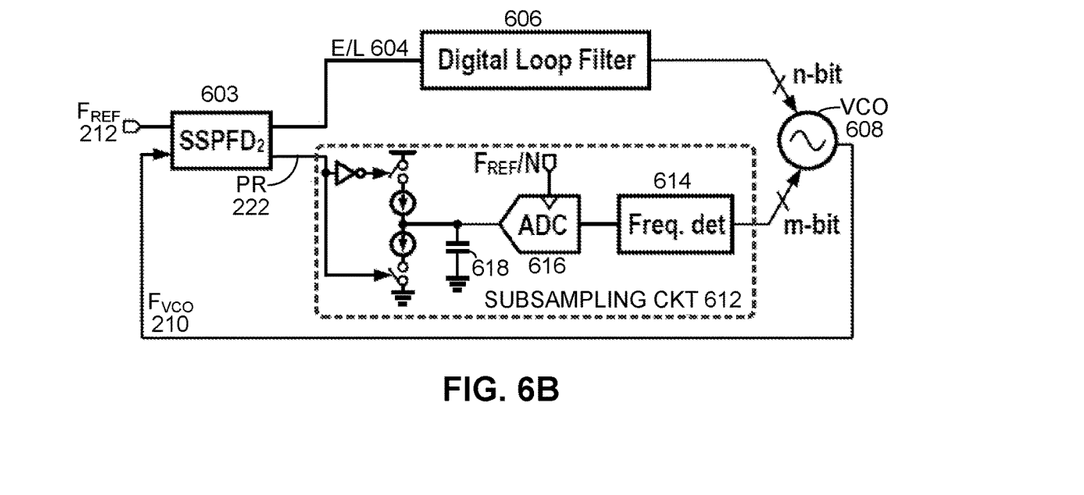
FIG. 6B illustrates a digital PLL which includes an SSPFD in accordance with the disclosed embodiments.

In contrast, the embodiment illustrated in FIG. 6A is a digital PLL, which includes a digital loop filter 606 located between $SSPFD_2$ 603 and the VCO 608. Note that subsampling circuit 612 in FIG. 6B is essentially the same as subsampling circuit 612 illustrated in FIG. 6A.

A number of practical points related to the implementation of these circuits are worth discussing. First, it is usually not an issue to obtain an extra-low reference frequency as is required in the proposed scheme to eliminate harmonic locking. If it turns out that only one reference frequency is available, standalone fractional dividers can always be adapted to generate the required extra-low reference frequency. (See A. Elkholy, A. Elshazly, S. Saxena, G. Shu and P. K. Hanumolu, "A 20-to-1000 MHz±14 ps peak-to-peak jitter reconfigurable multi-output all-digital clock generator using open-loop fractional dividers in 65 nm CMOS," in

TABLE I

| | $M = F_{VCO}/F_{REF}$ | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| PR_DC_$F_{REF}$ (%) | 3.34 | 3.34 | 0 | 0 | 3.34 | 3.34 | 3.34 | 0 | 0 | 3.34 | 3.34 | 3.34 |
| PR_DC_$1.1F_{REF}$ (%) | 18.5 | 36.4 | 54.6 | 72.5 | 91.3 | 91.0 | 73.1 | 54.3 | 36.4 | 18.2 | 3.0 | 18.5 |
| Slope | – | – | – | – | – | + | + | + | + | + | N/A | – |

To better understand the principle of the proposed subsampling frequency detector, Table I lists the duty cycle of PR at each harmonic of frequency $F_{REF}$ under the same conditions as illustrated in FIG. 4. Taking the slope of PR_DC_1.1FREF into consideration, the information in each column in Table I, which is associated with an integer ratio $F_{VCO}/F_{REF}$, is unique. Hence, these unique values can be used to resolve the issue of harmonic locking.

In practice, there exist many possible techniques for interpolating the information in FIG. 4 and Table I to achieve frequency locking during a subsampling operation. The PLLs illustrated in FIGS. 6A and 6B use one such technique, which is implemented in subsampling circuit 612. The basic idea is to first convert the duty cycle information into the digital domain using an analog-to-digital converter (ADC)

*IEEE International Solid-State Circuits Conference Digest of Technical Papers (ISSCC)*, San Francisco, Calif., 2014, pp. 272-273.) The elegance of the proposed scheme is that all the sampling operations are performed in a low frequency domain. This not only eliminates the need for a divider, but it also reduces the potentially high power consumption associated with high sampling frequencies.

Second, note that the extra reference frequency of $1.1F_{REF}$ is merely provided as an illustrative example. In general, the frequency-detection range of the system is not limited to 11 times $F_{REF}$. For example, choosing the second reference frequency to be $1.001F_{REF}$ provides a frequency-detection range of 1001. Note that the potential limitation of the frequency-detection range arises from the frequency resolution of the second reference frequency and the resolution of the ADC. Also note that the clocking frequency of the ADC 616 can be generated as a divided version of $F_{REF}$ 212 to achieve a judicious trade-off between the latency of the frequency-locking process and ADC power consumption.

Third, because the phase detector illustrated in FIG. 5 provides sufficient lock-in range, after the system achieves frequency locking, the subsampling PLL could potentially be placed into a frozen state or turned off to minimize power consumption of the PLLs.

Person-Identification Process

Figure 7A:
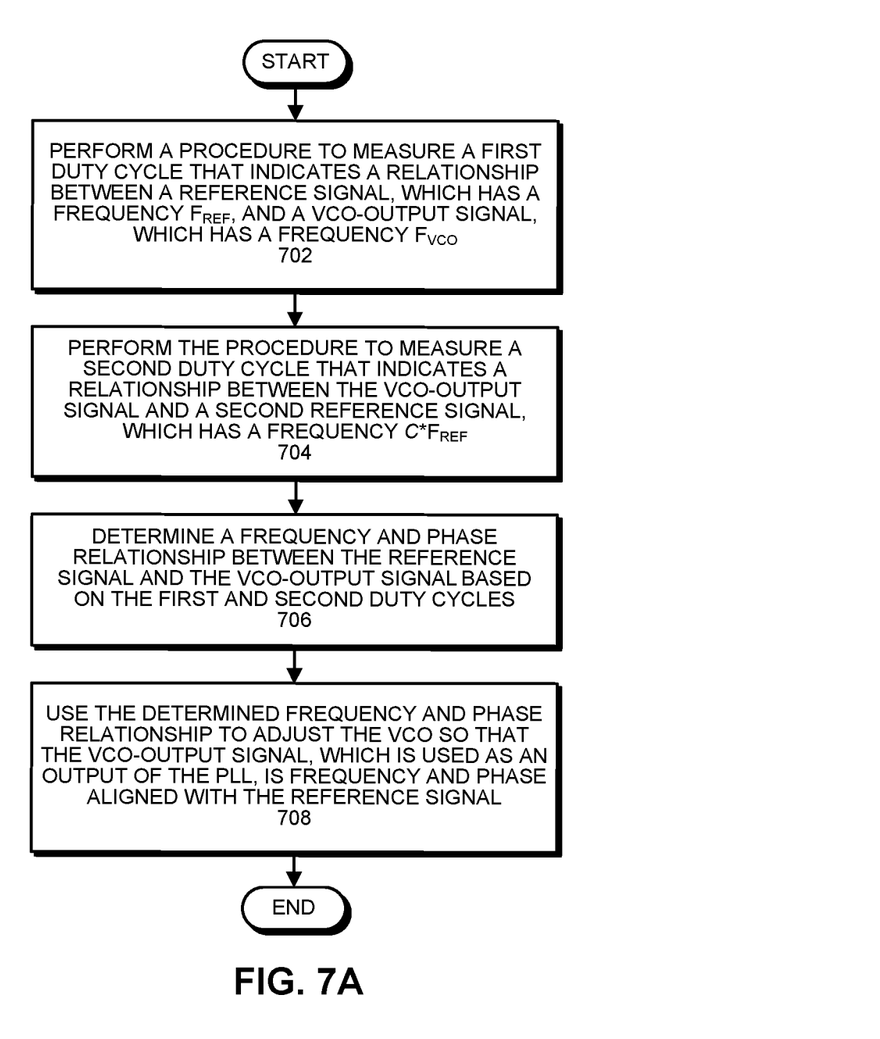
FIG. 7A presents a flow chart illustrating operations performed by a PLL that includes an SSPFD in accordance with the disclosed embodiments.

FIG. 7A presents a flow chart illustrating operations performed by a PLL system that includes an SSPFD in accordance with the disclosed embodiments. During operation, the system performs a procedure to measure a first duty cycle that indicates a relationship between a reference signal, which has a frequency $F_{REF}$, and a VCO-output signal, which has a frequency $F_{VCO}$ and is generated by a VCO in the PLL (step 702). The system also performs the procedure to measure a second duty cycle that indicates a relationship between the VCO-output signal and a second reference signal, which has a frequency $c*F_{REF}$ (step 704). Next, the system determines a frequency and phase relationship between the reference signal and the VCO-output signal based on the first and second duty cycles (step 706). Finally, the system uses the determined frequency and phase relationship to adjust the VCO so that the VCO-output signal, which is used as an output of the PLL, is frequency and phase aligned with the reference signal (step 708).

Figure 7B:
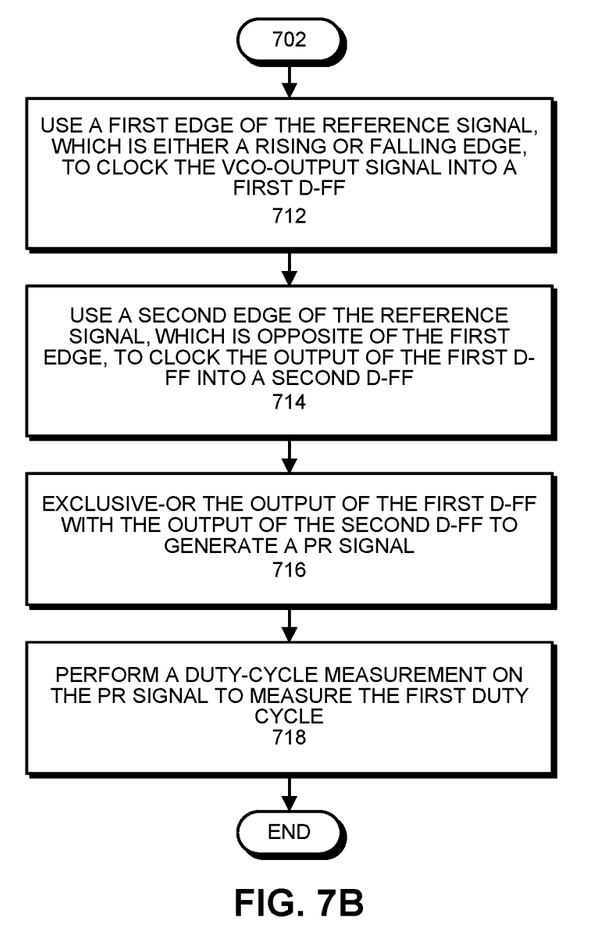
FIG. 7B presents a flow chart illustrating operations performed while generating a PR signal and measuring its duty cycle in accordance with the disclosed embodiments.

FIG. 7B presents a flow chart illustrating operations performed while generating a PR signal and measuring its duty cycle in accordance with the disclosed embodiments. This flow chart illustrates in more detail the operations perform in step 702 of the flow chart in FIG. 7A. While performing the operations, the system uses a first edge of the reference signal, which is either a rising or falling edge, to clock the VCO-output signal into a first D-FF (step 712). The system also uses a second edge of the reference signal, which is opposite the first edge, to clock the output of the first D-FF into a second D-FF (step 714). Next, the system exclusive-ORs the output of the first D-FF with the output of the second D-FF to generate a PR signal (step 716). Finally, the system performs a duty-cycle measurement on the PR signal to measure the first duty cycle (step 718).

System

Figure 8:
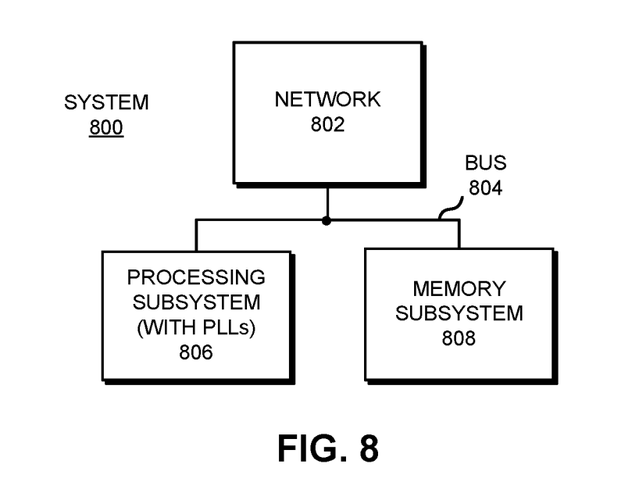
FIG. 8 illustrates a computer system that includes one or more PLLs in accordance with the disclosed embodiments.

One or more of the preceding embodiments of the PLL may be included in a system or device. More specifically, FIG. 8 illustrates a system 800 that includes a network 802 and a processing subsystem 806 comprising one or more processors (which include one or more PLLs) and a memory subsystem 808 comprising a random-access memory.

In general, components within system 800 may be implemented using a combination of hardware and/or software. Thus, system 800 may include one or more program modules or sets of instructions stored in a memory subsystem 808 (such as DRAM or another type of volatile or non-volatile computer-readable memory), which, during operation, may be executed by processing subsystem 806. Furthermore, instructions in the various modules in memory subsystem 808 may be implemented in: a high-level procedural language, an object-oriented programming language, and/or in an assembly or machine language. Note that the programming language may be compiled or interpreted, e.g., configurable or configured, to be executed by the processing subsystem.

Components in system 800 may be coupled by signal lines, links or buses, such as bus 804. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 800 may be at one location or may be distributed over multiple, geographically dispersed locations.

System 800 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, network 802 can be used in a wide variety of applications, such as: communications (for example, in a transceiver, an optical interconnect or an optical link, such as for intra-chip or inter-chip communication), a radio-frequency filter, a biosensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Other Implementations

It is also possible to use this duty-cycle-based frequency-tracking technique in other implementations of a PLL. For example, it is possible to include the VCO in a separate frequency-locked loop (FLL), which includes a divider (1/M), a frequency detector and a loop filter. This FLL is used to bring the VCO in the neighborhood of M times $F_{REF}$. Then, the duty-cycle-based frequency-tracking technique can be used to continuously lock the VCO to $F_{REF}$. This enables the system to optionally turn off the FFL and the associated divider circuitry.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for controlling a phase-locked loop (PLL), comprising:
    performing a procedure to measure a first duty cycle that indicates a relationship between a reference signal, which has a frequency $F_{REF}$, and a voltage-controlled oscillator (VCO) output signal, which has a frequency $F_{VCO}$ and is generated by a VCO in the PLL;
    performing the procedure to measure a second duty cycle that indicates a relationship between the VCO-output signal and a second reference signal, which has a frequency of $C*F_{REF}$;
    determining a frequency and phase relationship between the reference signal and the VCO-output signal based on the first and second duty cycles; and
    using the determined frequency and phase relationship to adjust the VCO so that that the VCO-output signal, which is used as an output of the PLL, is frequency and phase aligned with the reference signal.

2. The method of claim 1, wherein performing the procedure to measure the first duty cycle involves:
    using a first edge of the reference signal, which is either a rising or falling edge, to clock the VCO-output signal into a first D-flip-flop (D-FF);
    using a second edge of the reference signal, which is opposite the first edge, to clock the output of the first D-FF into a second D-FF;
    exclusive-ORing the output of the first D-FF with the output of the second D-FF to generate a PR signal; and
    performing a duty-cycle measurement on the PR signal to measure the first duty cycle.

3. The method of claim 2, wherein the first and second duty cycles are measured concurrently using parallel circuits, which each include a first D-FF, a second D-FF and an exclusive-OR gate.

4. The method of claim 2, wherein the first and second duty cycles are measured sequentially using a single circuit, which includes the first D-FF, the second D-FF and an exclusive-OR gate.

5. The method of claim 1, wherein a coefficient c is derived from the reference frequency $F_{REF}$ to produce a derived reference frequency $C*F_{REF}$, wherein the derived reference frequency is used while measuring the second duty cycle to prevent frequency aliasing problems caused by aligned harmonics between the first and second duty cycles.

6. The method of claim 1, wherein determining the frequency and phase relationship between $F_{REF}$ and $F_{VCO}$ based on the first and second duty cycles involves using a lookup table to look up the frequency and phase relationship based on the first and second duty cycles.

7. The method of claim 2, wherein performing the duty-cycle measurement on the PR signal involves:
    using the PR signal to charge a capacitor when the PR signal is high and discharge the capacitor when the PR signal is low; and
    measuring a voltage across the capacitor to determine the duty cycle.

8. The method of claim 1, wherein performing the duty-cycle measurement involves using a time-to-digital converter (TDC) to measure a delay to a specific signal transition within each cycle of the PR signal, wherein the delay is proportionate to the duty cycle.

9. The method of claim 1, wherein the PLL is an analog PLL, which includes an analog loop filter located between a subsampling phase frequency detector (SSPFD) PLL and the VCO.

10. The method of claim 1, wherein the PLL is a digital PLL, which includes a digital loop filter located between an SSPFD and the VCO.

11. The method of claim 2, wherein after the PLL achieves frequency locking, the method further comprises deactivating and/or turning off components in an SSPFD, which includes the first and second D-FFs and the exclusive-OR gate.

12. A phase-locked loop (PLL) circuit, comprising:
    a voltage-controlled oscillator (VCO) that generates a VCO-output signal, which is used as an output of the PLL circuit; and
    a sub-sampling phase frequency detector (SSPFD), which includes a first D-flip-flop (D-FF), a second D-FF and an exclusive-OR (XOR) gate, wherein the SSPFD performs a procedure to measure a first duty cycle that indicates a relationship between a reference signal, which has a frequency $F_{REF}$, and a voltage-controlled oscillator (VCO) output signal, which has a frequency $F_{VCO}$ and is generated by the VCO;
    wherein the SSPFD also performs the procedure to measure a second duty cycle that indicates a relationship between the VCO-output signal and a second reference signal, which has a frequency $c*F_{REF}$;
    wherein the SSPFD determines a frequency and phase relationship between the reference signal and the VCO-output signal based on the first and second duty cycles; and
    wherein the PLL circuit uses the determined frequency and phase relationship to adjust the VCO so that that the VCO-output signal is frequency and phase aligned with the reference signal.

13. The PLL circuit of claim 12, wherein performing the procedure to measure the first duty cycle involves:
    using a first edge of the reference signal, which is either a rising or falling edge, to clock the VCO-output signal into a first D-flip-flop (D-FF);
    using a second edge of the reference signal, which is opposite the first edge, to clock the output of the first D-FF into a second D-FF;
    exclusive-ORing the output of the first D-FF with the output of the second D-FF to generate a PR signal; and
    performing a duty-cycle measurement on the PR signal to measure the first duty cycle.

14. The PLL circuit of claim 13, wherein the first and second duty cycles are measured concurrently using parallel circuits, which each include a first D-FF, a second D-FF and an exclusive-OR gate.

15. The PLL circuit of claim 13, wherein the first and second duty cycles are measured sequentially using a single circuit, which includes the first D-FF, the second D-FF and an exclusive-OR gate.

16. The PLL circuit of claim 12, wherein a coefficient c is derived from the reference frequency $F_{REF}$ to produce a derived reference frequency $c*F_{REF}$, wherein the derived reference frequency is used while measuring the second duty cycle to prevent frequency aliasing problems caused by aligned harmonics between the first and second duty cycles.

17. The PLL circuit of claim 12, wherein while determining the frequency and phase relationship between $F_{REF}$ and $F_{VCO}$ based on the first and second duty cycles, the SSPFD uses a lookup table to look up the frequency and phase relationship based on the first and second duty cycles.

18. The PLL circuit of claim 13, wherein while performing the duty-cycle measurement on the PR signal, the SSPFD:
   uses the PR signal to charge a capacitor when the PR signal is high and discharge the capacitor when the PR signal is low; and
   measures a voltage across the capacitor to determine the duty cycle.

19. The PLL circuit of claim 13, wherein after the PLL circuit achieves frequency locking, the PLL circuit deactivates and/or turns off components in an SSPFD, which includes the first and second D-FFs and the exclusive-OR gate.

20. A computer system, comprising:
   at least one processor and at least one associated memory; and
   a phase-locked loop (PLL) circuit, which includes:
      a voltage-controlled oscillator (VCO) that generates a VCO-output signal, which is used as an output of the PLL circuit; and
      a sub-sampling phase frequency detector (SSPFD), which includes a first D-flip-flop (D-FF), a second D-FF and an exclusive-OR (XOR) gate, wherein the SSPFD performs a procedure to measure a first duty cycle that indicates a relationship between a reference signal, which has a frequency $F_{REF}$, and a voltage-controlled oscillator (VCO) output signal, which has a frequency $F_{VCO}$ and is generated by the VCO;
   wherein the SSPFD also performs the procedure to measure a second duty cycle that indicates a relationship between the VCO-output signal and a second reference signal, which has a frequency $C*F_{REF}$;
   wherein the SSPFD determines a frequency and phase relationship between the reference signal and the VCO-output signal based on the first and second duty cycles; and
   wherein the PLL circuit uses the determined frequency and phase relationship to adjust the VCO so that the VCO-output signal is frequency and phase aligned with the reference signal.

* * * * *

UNITED STATES PATENT AND TRADEMARK OFFICE
CERTIFICATE OF CORRECTION

PATENT NO.         : 10,425,092 B2                                    Page 1 of 1
APPLICATION NO.    : 15/647716
DATED              : September 24, 2019
INVENTOR(S)        : Shu et al.

It is certified that error appears in the above-identified patent and that said Letters Patent is hereby corrected as shown below:

In the Specification

In Column 2, Line 27, after "c*$F_{REF}$" insert -- . --.

In Column 5, Line 16, after "$F_{VCO}/F_{REF}$" insert -- . --.

In Column 5, Line 21, after "$F_{REF}$" insert -- . --.

In Column 5, Line 57, delete "1.1FREF" and insert -- 1.1$F_{REF}$ --, therefor.

In the Claims

In Column 9, Line 27, in Claim 1, delete "C*$F_{REF}$;" and insert -- $c*F_{REF}$; --, therefor.

In Column 9, Line 33, in Claim 1, delete "that that" and insert -- that --, therefor.

In Column 9, Line 59, in Claim 5, delete "C*$F_{REF}$," and insert -- $c*F_{REF}$, --, therefor.

In Column 10, Line 45, in Claim 12, delete "that that" and insert -- that --, therefor.

In Column 12, Line 19, in Claim 20, delete "C*$F_{REF}$;" and insert -- $c*F_{REF}$; --, therefor.

Signed and Sealed this
Eighth Day of September, 2020

Andrei Iancu
*Director of the United States Patent and Trademark Office*